United States Patent [19]

Bohrer

[11] Patent Number: 4,962,344

[45] Date of Patent: Oct. 9, 1990

[54] SEGMENTED WAVEFORM GENERATOR

[75] Inventor: Mark W. Bohrer, Saratoga, Calif.

[73] Assignee: Advanced Micro Devices, Inc., Sunnyvale, Calif.

[21] Appl. No.: 356,794

[22] Filed: May 23, 1989

[51] Int. Cl.$^5$ .............................................. H03K 3/86
[52] U.S. Cl. .................................... 307/260; 307/261; 328/14; 328/22; 328/36
[58] Field of Search ............... 307/260, 261, 263, 271; 328/14, 22, 27, 35, 36, 181, 185

[56] References Cited

U.S. PATENT DOCUMENTS

| | | | |
|---|---|---|---|
| 3,988,682 | 10/1976 | Mikonis | 307/228 |
| 4,030,121 | 6/1977 | Faroudjg | 307/263 |
| 4,032,834 | 6/1977 | Beierholm | 307/260 |
| 4,368,433 | 1/1983 | Imazeki et al. | 328/14 |
| 4,422,044 | 12/1983 | Mueller | 307/228 |
| 4,443,713 | 4/1984 | Layton | 307/228 |
| 4,517,520 | 5/1985 | Ogawa | 307/261 |
| 4,567,378 | 1/1986 | Raver | 307/263 |
| 4,849,652 | 7/1989 | Hulshof | 307/261 |

Primary Examiner—Stanley D. Miller
Assistant Examiner—T. Cunningham
Attorney, Agent, or Firm—Fliesler, Dubb, Meyer & Lovejoy

[57] ABSTRACT

A segmented waveform generator comprising a plurality of ramp generators whose outputs are coupled to and summed in a summing circuit to provide a waveform having a desired harmonic content or shape. The ramp generators are triggered by the rising and falling edges of trigger pulses to provide symmetrical segmented waveforms.

12 Claims, 4 Drawing Sheets

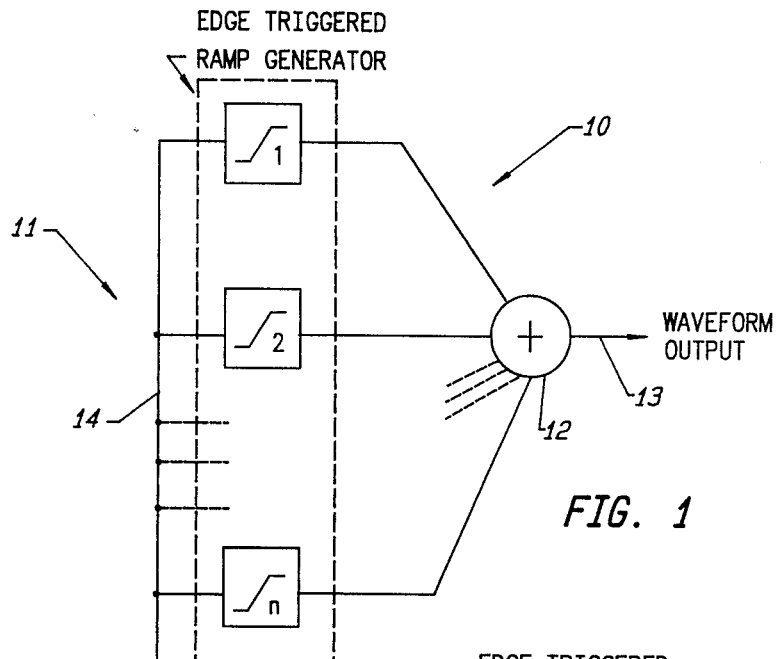
FIG. 1
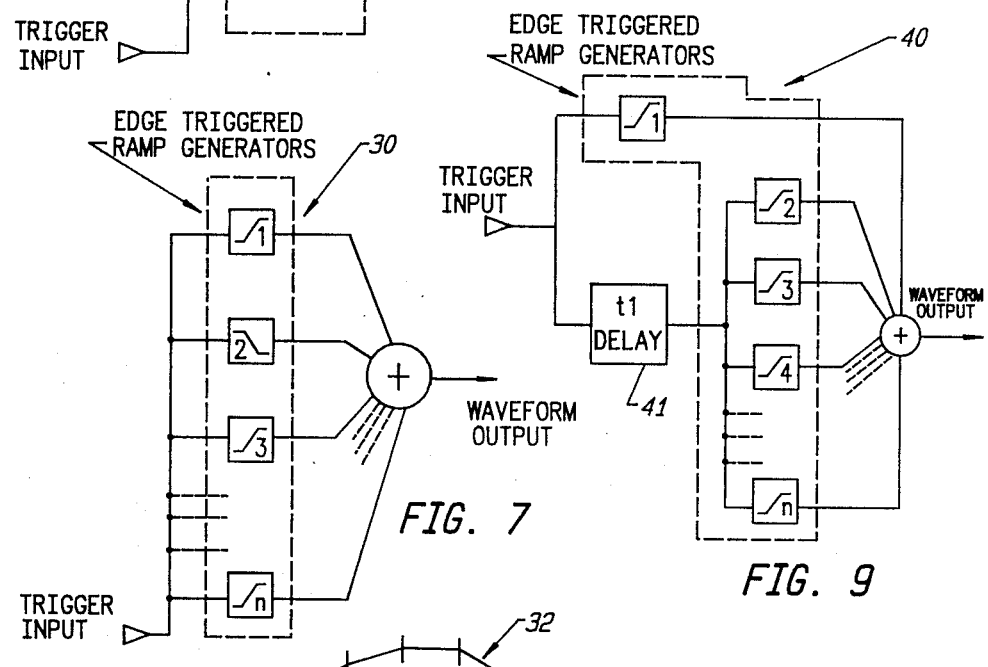
FIG. 7
FIG. 9
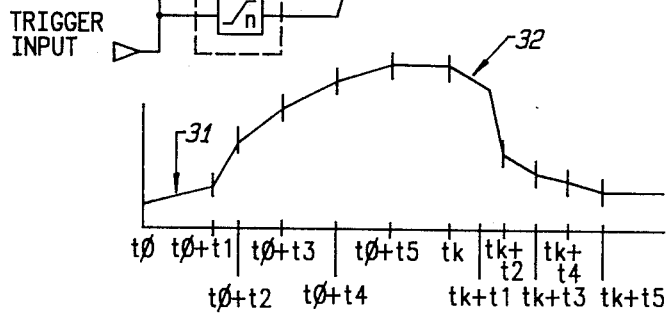
FIG. 8

RISING EDGE

FALLING EDGE

SEGMENTED WAVEFORM GENERATOR

BACKGROUND OF THE INVENTION

1. Field of the Invention

The present invention relates to signal generators in general and in particular to a signal generator for providing symmetrical complex waveforms having a predetermined harmonic content and closely matched rising and falling edges.

2. Description of the Prior Art

Various techniques have been used in the past for generating complex waveforms having a selected harmonic content.

Among the various techniques which have been used, one well known technique, called subtractive synthesis, comprises a plurality of analog filters. Beginning with a harmonically rich waveform, such as a squarewave or sawtooth, the filters, comprising RC networks, filter out selected frequencies and/or bands of frequencies from the output of an oscillator to produce a desired waveform. While widely used, it is some times difficult to achieve desired waveforms using analog filters because such filters are typically sensitive to manufacturing and/or process variations.

Another well known technique comprises a plurality of individual ramp generators. A ramp generator provides an output, either current or voltage, which ramps either up or down from a predetermined initial magnitude to a predetermined final magnitude in a linear fashion.

In the past, it has been the practice to operate the ramp generators in sequence such that when one of the ramp generators has reached its predetermined final magnitude, a second ramp generator is triggered to provide its output. When the second ramp generator has reached its final magnitude, a third ramp generator is triggered to provide its output, and so on, until the desired waveform is provided. The number of ramp generators required and the slope and duration of each of their outputs depends on the complexity, i.e. harmonic content, of the waveform desired.

The above-described prior known use of ramp generators requires that the final and initial outputs of each of the ramp generators in the sequence be exactly matched and that the trigger signals be timed precisely so as not to produce undesired inflections and discontinuities in the complex waveform being generated. Such discontinuity-free operation is difficult to achieve especially when a large number of ramp generators is required.

SUMMARY OF THE INVENTION

In view of the foregoing, principal objects of the present invention are a method and apparatus for generating complex symmetrical waveforms using a plurality of ramp generators which are triggered by the same trigger signal.

In accordance with the above objects there is provided a plurality of ramp generators which are coupled in parallel to a summing circuit.

In operation, in response to the same trigger signal, each of the ramp generators provides an output either a current or a voltage which ramps either up or down from a predetermined initial magnitude to a predetermined final magnitude in a linear fashion and within a predetermined period of time. The outputs of the ramp generators are then added in the summing circuit to provide the desired complex waveform.

In a first embodiment of the present invention, all of the ramp generators therein are synchronized by a first and a second trigger signal and provide a first output having a positive slope in response to the first trigger signal and a second output having a negative slope in response to the second trigger signal. The resulting outputs from the ramp generator are then added in the summing circuit to provide a symmetrical waveform having closely matched rising and trailing edges.

In a second embodiment of the present invention, the circuitry and its operation are identical to the first embodiment with the exception that one or more of the ramp generators provides a first output having a negative slope in response to the first trigger signal and a second output having a positive slope in response to the second trigger signal.

In a third embodiment of the present invention, the circuitry and its operation are identical to either the first or the second embodiment described above except that the first and the second trigger signals applied to a selected number of the ramp generators are delayed for a predetermined period of time.

In the preferred embodiments, the first trigger signal is the leading edge of a trigger pulse and the second trigger signal is the trailing edge of the same pulse. The time between the leading and trailing edges of the trigger pulse and vice versa determines the period of time the output of a ramp generator remains at its respective final magnitude.

Applying the same trigger signal, whether or not delayed, to all of the ramp generators as described above provides an easy to manipulate mathematically simple means for generating useful classes of complex waveforms. All that is required is to set the slope and duration of the output of each of the ramp generators such that the sum of their outputs as a function of time corresponds to the magnitude of the desired waveform as a function of said time.

BRIEF DESCRIPTION OF THE DRAWINGS

The above and other objects, features and advantages of the present invention will become apparent from the following detailed description of the accompanying drawings, in which:

FIG. 1 is a generalized block diagram of a complex waveform generator according to the present invention;

FIG. 7 is a block diagram of an alternative embodiment of the present invention;

FIG. 8 is a drawing of a complex waveform produced by the apparatus of FIG. 7;

FIG. 9 is a block diagram of an alternative embodiment of the present invention which also may be used for generating the waveform of FIG. 8;

DETAILED DESCRIPTION OF THE INVENTION

Referring to FIG. 1, there is provided in accordance with the present invention a segmented waveform generator designated generally as 10. In the generator 10 there is provided a plurality of ramp generators 11 designated 1, 2 ... n, respectively. In each of the generators 11 there is provided an output and a trigger signal input. The output of each of the ramp generators 11 is coupled to an input of a summing circuit 12. The output of circuit 12 is coupled to a line 13. The trigger signal input of each of the ramp generators 11 is coupled to a source of trigger signals by means of an input line 14. As will be further described below with respect to FIGS. 2–4, in operation each of the ramp generators 11 produces a portion or segment of the final output waveform on the line 13.

In operation, the trigger signals applied to the line 14 comprise pulses having a leading edge, a trailing edge, and a predetermined duration and interval. In response to the leading edge of a trigger pulse, each of the ramp generators 11 ramps up, i.e. provides an output having a positive slope, from a predetermined initial magnitude to a predetermined final magnitude within a predetermined period of time in a linear fashion. Thereafter, the output is maintained at said final magnitude until the trailing edge of the trigger is received. Upon receipt of the trailing edge of the trigger pulse, the output of each of the generators 11 ramps down, i.e. provides an output having a negative slope, from said final magnitude to its initial magnitude in said predetermined period of time, and thereafter remain constant until the leading edge of the next trigger pulse.

Figure 2:
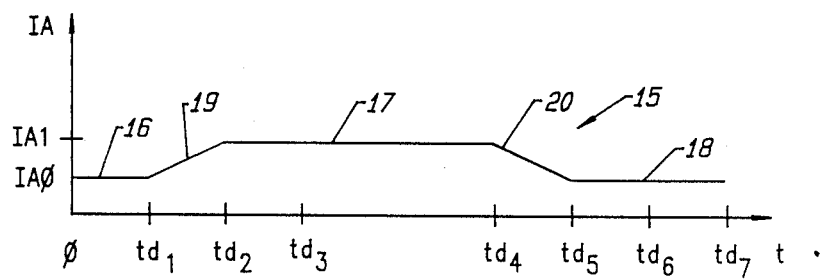
FIG. 2 is a drawing of an exemplary output of one of the ramp generators of FIG. 1.

Referring to FIG. 2, there is shown a waveform 15 which represents an exemplary output of ramp generator 1 of FIG. 1. Waveform 15 comprises a plurality of segments 16, 17 and 18 having a constant magnitude, a segment 19 having a positive slope and a segment 20 having a negative slope. Each of the segments has a predetermined duration.

Figure 3:
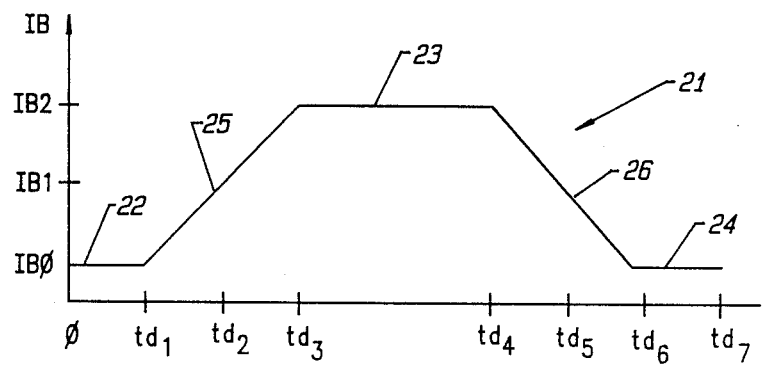
FIG. 3 is a drawing of an exemplary output of a second ramp generator in the circuit of FIG. 1.

Referring to FIG. 3, there is shown a waveform 21 which represents an exemplary output of ramp generator 2 of FIG. 1. Waveform 21 comprises a plurality of segments 22, 23 and 24 having a constant magnitude, a segment 25 having a positive slope and a segment 26 having a negative slope. Each of the segments has a predetermined duration.

Figure 4:
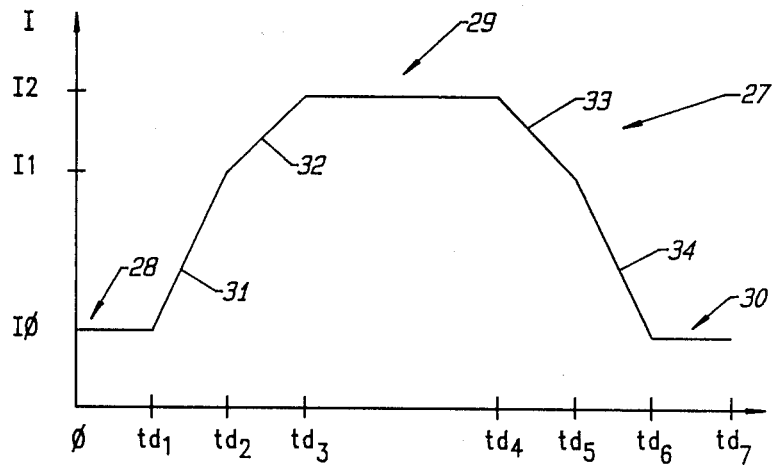
FIG. 4 is a complex waveform generated by adding the outputs of the two ramp generators as shown in FIGS. 2 and 3.

Referring to FIG. 4, there is shown a waveform 27 which represents the output of summing circuit 11 of FIG. 1 which is generated in response to inputs from generators 1 and 2. The waveform 27 has a plurality of segments 28, 29 and 30 having a constant magnitude, a pair of segments 31 and 32 having a positive slope and a pair of segments 33 and 34 having a negative slope. As will be noted, segment 28 comprises the sum of segments 16 and 22; segments 31 and 32 comprise the sum of segments 19 and 25; segment 29 comprises the sum of segments 17 and 23; segments 33 and 34 comprise the sum of segments 20 and 26; and segment 30 comprises the sum of segments 18 and 24.

While the duration of each of the segments of the waveforms 15, 21 and 27 described above is determined by the desired characteristics, i.e. the shape or harmonic content, of the waveform desired on the output of summing circuit 11, it will be noted that the beginning of the leading and trailing edges occur at the same time, i.e. $t_{d1}$ and $t_{d4}$, respectively, and that the waveform is symmetrical.

In general, the scope and duration of the output of each of the generators 11 is determined by performing a piecewise linear approximation of the desired waveform. For example, consider the problem of approximating the waveform 27 of FIG. 4. The waveform 27 is symmetrical with equal rise and fall times. If one were to construct a piecewise linear approximation of the rising edge, 31,32 of the waveform 27, one could use the same piecewise linear approximation for the falling edge of 33,34 if one were to simply reverse the sign of the slopes of the linear pieces with the waveform as seen comprising a straight line 29, i.e. constant magnitude, between the edge transitions.

Figure 5:
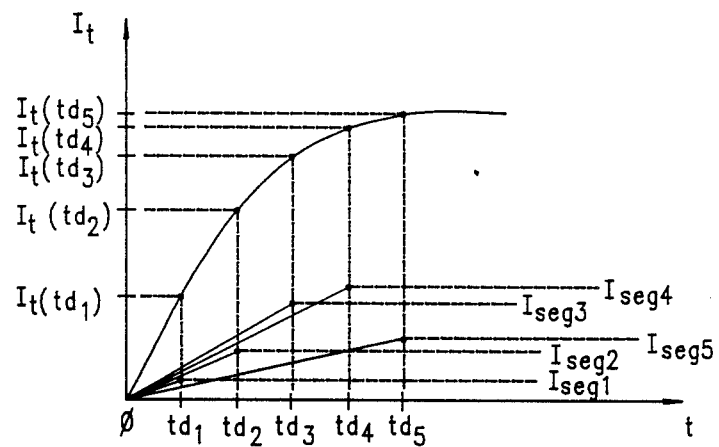
FIGS. 5 and 6 are drawings illustrating a waveform constructed by piecewise linear approximation and the sum of the segments.
Figure 6:
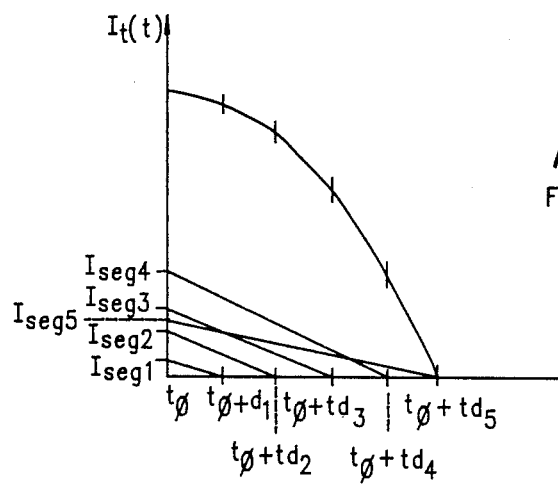

Referring to FIGS. 5 and 6, to approximate rising and falling edges as for the waveform 27 of FIG. 4, the following method can be used to generate a piecewise linear approximation. For example, one can draw several line segments with a common endpoint at an origin, and their other end points at ($t_{di}$, $I_{segi}$) for each segment $i$. Then, each segment can be described by the following equation:

$$I_i = I_{segi} \times t/t_{di}, \quad t \leq t_{di} \tag{1}$$

$$I_{segi}, \quad t > t_{di}$$

where
$I_i$ = output current

The total current $I_t(t)$ is the sum of all of the $I_i$. That is:

$$I_t(t) = \sum_{i=1}^{n} I_i \tag{2}$$

If one chooses the $t_{di}$ such that the fraction $1/n$ of the total rise time of the wave form of interest is equal to $t_{di+1} - t_{di}$, and writes the equations for the slopes $M_i$ of the straight-line approximations to the waveform between each pair of $t_{di}$, one can solve the equations for $I_{segi}$, as follows:

$$I_{t(\phi)} = I\phi \tag{3}$$

where $I_\phi$ is the output waveform starting magnitude. Then $$I_t(t_{d1}) = I\phi + I_1 + \frac{t_{d1}}{t_{d2}} I_2 + \frac{t_{d1}}{t_{d3}} I_3 + \ldots + \frac{t_{d1}}{t_{dn}} I_n \tag{4}$$

$$M_1 = \frac{I_t(t_{d1}) - I_{t(\phi)}}{t_{d1}} = \frac{I_1}{t_{d1}} + \frac{I_2}{t_{d2}} + \ldots + \frac{I_n}{t_{dn}} \tag{5}$$

$$I_t(t_{d2}) = I_1 + I_2 + \frac{t_{d2}}{t_{d3}} I_3 + \frac{t_{d2}}{t_{d4}} I_4 + \ldots + \frac{t_{d2}}{t_{dn}} I_n \tag{6}$$

$$M_2 = \frac{I_t(t_{d2}) - I_{t(t_{d1})}}{t_{d2} - t_{d1}} = \frac{I_2}{t_{d2}} + \frac{I_3}{t_{d3}} + \ldots + \frac{I_n}{t_{dn}} \tag{7}$$

In general $$M_k = \sum_{i=k}^{n} \frac{I_{segi}}{t_{di}}, \text{ with} \tag{8}$$

$$I_{segi} = I_{SEG\ FINAL\ i} - \phi I \tag{9}$$

The $M_k$ are taken directly from the piecewise linear approximation to the waveform. Since one knows the values of $M_k$ and the $t_{di}$, one can solve the set of n equations for the $I_{segi}$ using matrix methods. The $I_{segi}$ and the $t_{di}$ completely specify each segment.

Referring again to FIG. 4, each of the above-described segments of waveform 27 consists of the output from the linear ramp generators 11 which starts at a value $I_\phi$ and ramps up to its final value $I_{segi}$ in time $t_{di}$. All the ramp generator outputs are summed to produce the total output current $I_r(t)$, which is the approximate waveform rising edge.

The falling edge is created by ramping each segment down (starting the downward ramp of each segment at the same time $t_\phi$ from $I_{segi}$ to $I_\phi$ in time $t_{di}$).

As previously described, rising ramps are triggered by the rising input trigger edge. Falling ramps are triggered by the falling input trigger edge. The time between output waveform edges, i.e. the duration of the constant magnitude levels of the output waveform, is determined by the time between input trigger edges.

Thus far, the synthesis of waveform edges with steadily increasing or steadily decreasing slope has been described. There are, however, two methods of generating arbitrary slope changes using the basic idea described above.

Referring to FIG. 7, there is provided a segmented waveform generator designated generally as 30 in which there is provided a plurality of ramp generators 1, 2, 3 . . . n. Circuit 30 and its operation are identical to the operation of the circuit of FIG. 1 except that ramp generator 2 provides an output having a negative slope in response to the rising edge of a trigger pulse and a positive slope in response to the falling edge of the trigger pulse.

As shown in FIG. 8, generator 2 of FIG. 7, providing an output with a negative slope in response to the rising edge of the trigger pulse, will cause the first part of the output waveform to have an increase in slope at the first part of a rising edge, as shown at 31, and a decrease in slope at the first part of a falling edge, as shown at 32.

By proper choice of increasing and decreasing ramps with appropriate timing and amplitude, any waveform can be created. The only disadvantage is that output waveform peak points are determined by the start and finish amplitudes of the mixture of ramps. In the example of FIGS. 7 and 8, the negative peak sits above zero by an amount equal to the starting amplitude of generator 2, the falling ramp segment. However, if the waveform is AC coupled, this presents no problem.

Referring to FIG. 9, there is provided in another embodiment of the present invention a waveform generator designated generally as 40. In the circuit 40 there is provided a plurality of ramp generators 1, 2, 3, 4 . . . n. Circuit 40 and its operation are identical to the circuit and operation of either circuit 10 or circuit 30 of FIGS. 1 and 7, except that the trigger signal applied to the ramp generators 2, 3, 4 . . . n is delayed by a period $t_1$ in a delay circuit 41. The delay $t_1$ is chosen to produce a trigger to generators 2 . . . n just as the ramp from generator 1 reaches its end point. Circuit 30 will produce the wave shape of FIG. 6 except that the waveform peaks can be arbitrarily chosen by the proper choice of ramp amplitudes. Thus, combinations of single delayed-trigger cascaded segments, or cascades of groups of segments can be used to create almost any waveform.

Figure 10:
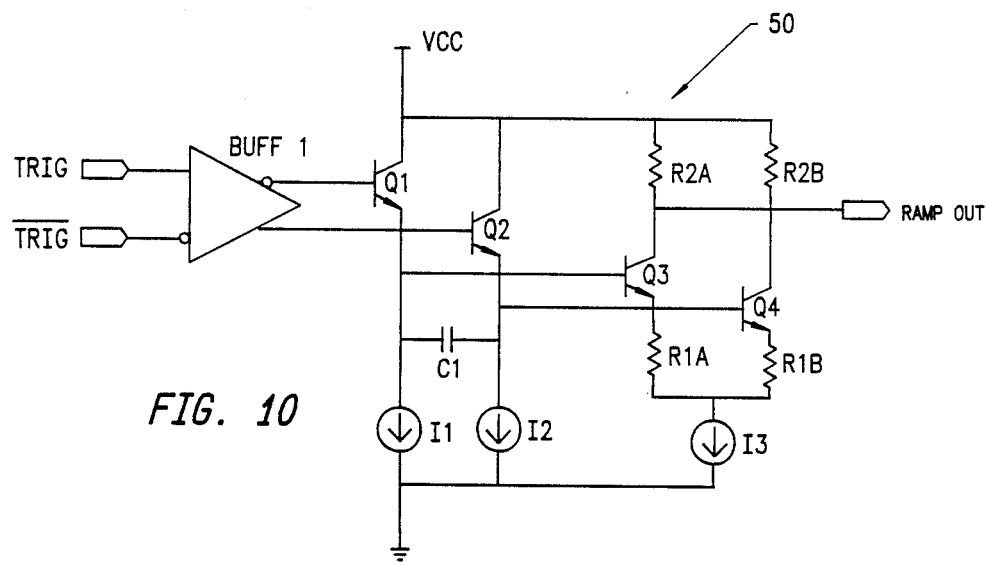
FIG. 10 is a block diagram of a ramp generator according to the present invention.
Figure 11:
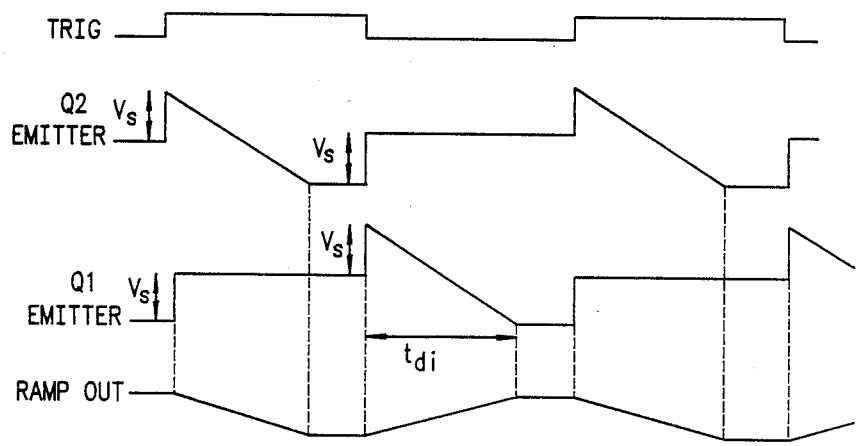
FIG. 11 is a diagram of waveforms at selected modes in the generator of FIG. 10.

Referring to FIGS. 10 and 11, there is provided in accordance with the present invention a ramp generator designated generally as 50. In the generator 50 there is provided a buffer BUFF1, a plurality of transistors Q1-Q4, associated resistors R1A, R2A, R1B and R2B, a capacitor C1 and three current sources I1, I2 and I3.

In operation, differential trigger signals TRIG and $\overline{\text{TRIG}}$ are applied to buffer BUFF1. BUFF1's output has a well-controlled differential voltage swing $V_s$, and rise and fall times that are short compared to the desired output ramp time. With a rising trigger edge, BUFF1 drives Q1's base low and Q2's base high. Q2's emitter rises at almost the same rate as its base. C1 has charged up to $V_s$ before the occurrence of the rising trigger edge. As a result, when Q2's emitter rises, Q1's emitter also rises, reaching a voltage that is $V_s$ above Q2's final voltage at the end of the trigger rising edge. However, current source I1 will then force Q1's emitter to ramp down to a voltage that is $V_s$ below Q2's emitter voltage. The ramp rate $t_{di}$ is given by $$t_{di} = (2 \times V_s \times C1)/I1$$

if Q3's base current is small. A falling trigger edge causes a similar sequence of events, with Q1's base and emitter rising and Q2's emitter ramping down. I1 and I2 are equal currents, so the same equation for $t_{di}$ describes the ramp rate for a falling trigger edge.

Q3, Q4, R1A, R1B, R2A, R2B, and I3 form a controlled output swing linear amplifier. This amplifier provides an output ramp at RAMP OUT with ramp time $t_{di}$, initial voltage $V_{CC} - I3 \times R2A$, and final voltage $V_{CC}$. R1A and R2A linearize the transfer characteristic of the Q3-Q4 differential pair, causing the pair to linearly switch its output over the entire input range.

While preferred embodiments of the present invention are described above, it is contemplated that various modifications may be made thereto without departing from the spirit and scope of the present invention. Accordingly, it is intended that the embodiments described be considered only as illustrative of the present invention and that the scope thereof should not be limited thereto but be determined by reference to the claims hereinafter provided.

What is claimed is:

1. An apparatus for generating segmented waveforms comprising:
   a plurality of ramp generators, each of said ramp generators having an input, an output and a means responsive to the leading edge of a trigger signal applied to said input for causing said output to change from a first magnitude to a second magnitude within a predetermined period of time in a linear fashion and to the trailing edge of said trigger signal for causing said output to change from said second magnitude to said first magnitude within said predetermined period of time in said linear fashion;
   means for summing the outputs of said plurality of ramp generators; and
   means for coupling said output of said ramp generators to said summing means.

2. An apparatus according to claim 1 wherein the output of each one of said plurality of ramp generators has a positive slope as said output changes from said first magnitude to said second magnitude.

3. An apparatus according to claim 1 wherein the output of each one of a first selected number of said plurality of ramp generators has a positive slope as said output changes from said first magnitude to said second magnitude and the output of each one of the remaining ones of said plurality of ramp generators has a negative slope as said output changes from said first magnitude to said second magnitude.

4. An apparatus according to claim 1 comprising means for applying said trigger signal simultaneously to all of said plurality of ramp generators.

5. An apparatus according to claim 1 comprising:
means for applying said trigger signal without any appreciable delay to a selected number of said plurality of ramp generators; and
means for delaying the application of said trigger signal applied to the remainder of said plurality of ramp generators.

6. An apparatus according to claim 5 wherein said delaying means comprises means for delaying the application of said trigger signal to said remainder of said ramp generators for a predetermined period of time.

7. A method of generating a segmented waveform using a plurality of ramp generators, each having a trigger signal input and an output, and a summing circuit comprising the steps of:
applying a trigger signal having a leading edge and a trailing edge to said trigger signal input in each of said ramp generators;
providing an output from each of said ramp generators which in response to said leading edge of said trigger signal changes from a first magnitude to a second magnitude and in response to said trailing edge of said trigger signal changes from said second magnitude to said first magnitude; and
summing said outputs of said ramp generators in said summing circuit for providing said waveform.

8. A method according to claim 7 wherein the output of each one of said plurality of ramp generators has a positive slope as said output changes from said first magnitude to said second magnitude.

9. A method according to claim 7 wherein the output of each one of a first selected number of said plurality of ramp generators has a positive slope as said output changes from said first magnitude to said second magnitude and the output of each one of the remaining ones of said plurality of ramp generators has a negative slope as said output changes from said first magnitude to said second magnitude.

10. A method according to claim 7 comprising the step of applying said trigger signal simultaneously to all of said plurality of ramp generators.

11. A method according to claim 7 comprising the steps of:
applying said trigger signal without any appreciable delay to a selected number of said plurality of ramp generators; and
delaying the application of said trigger signal applied to the remainder of said plurality of ramp generators.

12. A method according to claim 5 wherein said delaying step comprises the step of delaying the application of said trigger signal to said remainder of said ramp generators for a predetermined period of time.

* * * * *